United States Patent
Taylor

(10) Patent No.: US 7,292,097 B2
(45) Date of Patent: Nov. 6, 2007

(54) AMPLIFIER AND METHOD FOR PROCESSING SIGNALS

(75) Inventor: Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 11/009,299

(22) Filed: Dec. 10, 2004

(65) Prior Publication Data

US 2006/0139100 A1     Jun. 29, 2006

(51) Int. Cl.
*H03F 1/24* (2006.01)

(52) U.S. Cl. ............. 330/98; 330/99; 330/282; 330/310; 330/311

(58) Field of Classification Search ........ None
See application file for complete search history.

(56) References Cited

U.S. PATENT DOCUMENTS

| | | | |
|---|---|---|---|
| 4,559,503 A * | 12/1985 | Camand et al. | 330/310 |
| 4,706,038 A * | 11/1987 | Navidi et al. | 330/311 |
| 6,046,642 A * | 4/2000 | Brayton et al. | 330/310 |
| 6,118,991 A * | 9/2000 | Jean et al. | 330/310 |
| 6,407,640 B1 | 6/2002 | Aparin et al. | |
| 6,754,478 B1 | 6/2004 | Lee | |

\* cited by examiner

*Primary Examiner*—Khanh Van Nguyen
(74) *Attorney, Agent, or Firm*—Schwegman, Lundberg & Woessner, P.A.

(57) ABSTRACT

In some embodiments, an apparatus includes an amplifier circuit and a bias circuit coupled to the amplifier. The amplifier circuit includes an input port and an output port, an input port circuit element coupled to the input port, an output port circuit element coupled to the output port, and an internal signal path to couple the input port circuit element to the output port circuit element. The output port is coupled to the input port, the bias circuit, and the internal signal path. In some embodiments, a method includes receiving an input signal at an input port of an amplifier, processing the input signal to produce an output signal at an output port of the amplifier, controlling bandwidth in the amplifier by feeding back the output signal to an internal signal path in the amplifier, controlling biasing in the amplifier by coupling the output signal to a bias circuit coupled to the amplifier, and controlling input impedance in the amplifier by coupling the input port to the output port through an impedance.

25 Claims, 5 Drawing Sheets

US 7,292,097 B2

AMPLIFIER AND METHOD FOR PROCESSING SIGNALS

FIELD

The subject matter relates to electronic circuits and more particularly to amplifier circuits.

BACKGROUND

An amplifier circuit processes a signal by increasing a signal parameter, such as the amplitude of the signal. Amplifier circuits are used as building blocks in signal processing systems. For example, amplifier circuits are used in communication systems to increase the amplitude of a received signal. Some desirable properties for amplifier circuits used in signal processing systems include low noise, wide bandwidth, small die area, a controllable bias circuit, limited return loss, high stability, and a controllable input impedance. Some low noise amplifiers attempt to provide some of these desirable properties through the use of inductors. Unfortunately, the use of inductors increases the die space occupied by the amplifier. Further, amplifiers that have a low noise figure and do not include inductors fail to provide the other desirable parameters at values that meet the specifications of many signal processing systems.

DESCRIPTION

Figure 1:
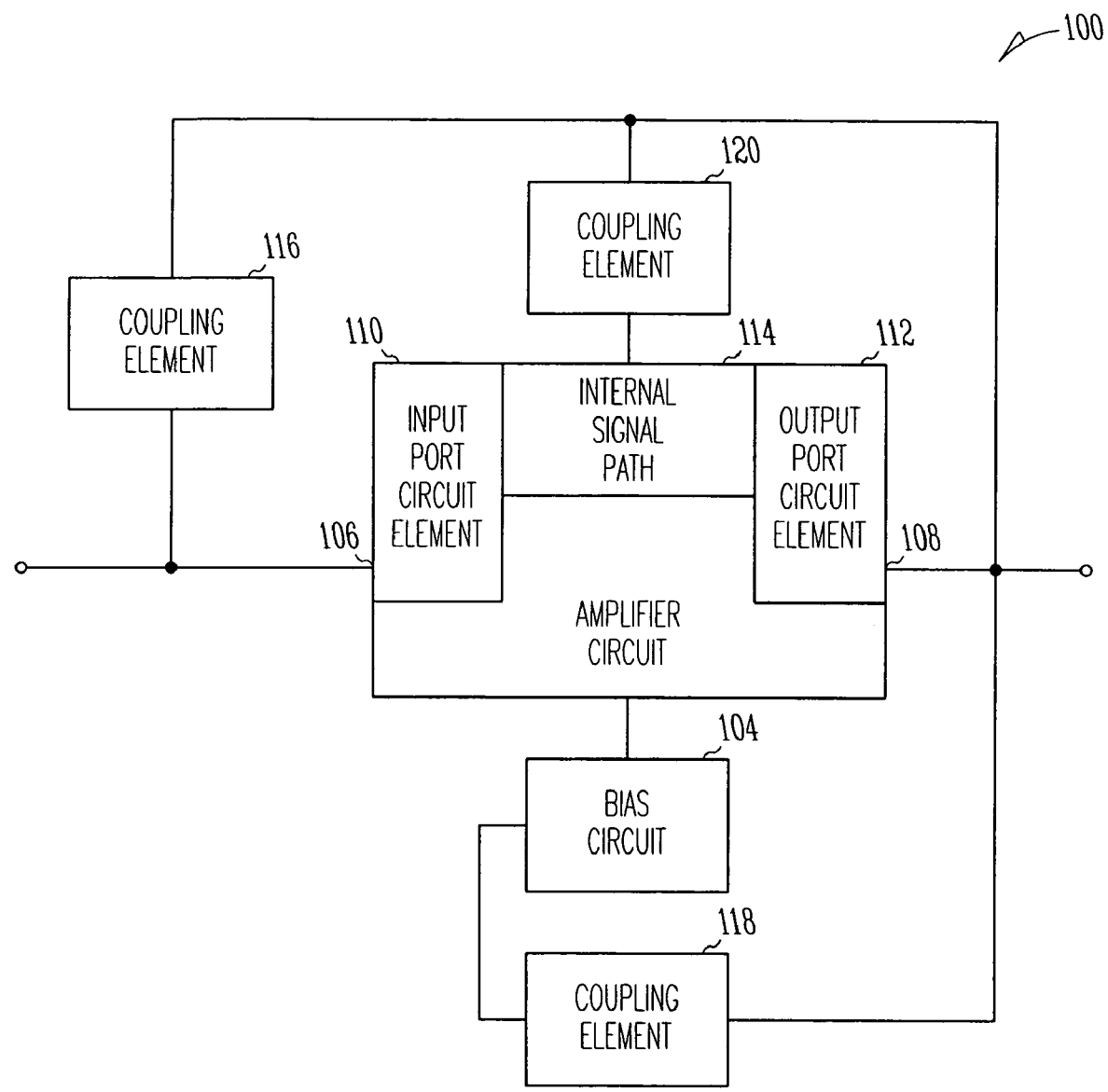
FIG. 1 is a block diagram of an apparatus including an amplifier circuit coupled to a bias circuit in accordance with some embodiments.

In the following description of some embodiments of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice embodiments of the invention. Other embodiments may be utilized and structural, logical, and electrical changes may be made without departing from the scope of the invention. The following detailed description is not to be taken in a limiting sense, and the scope of the invention is defined only by the appended claims, along with the full scope of equivalents to which such claims are entitled.

FIG. 1 is a block diagram of an apparatus 100 including an amplifier circuit 102 coupled to a bias circuit 104 in accordance with some embodiments. The amplifier circuit 102 includes an input port 106, an output port 108, an input port circuit element 110, an output port circuit element 112, and an internal signal path 114. The input port circuit element 110 is coupled to the input port 106. The output port circuit element 112 is coupled to the output port 108. The internal signal path 114 couples the input port circuit element 110 to the output port circuit element 112. The output port 108 is coupled to the input port 106, the bias circuit 104, and the internal signal path 114. A coupling element 116 couples the output port 108 to the input port 106. A coupling element 118 couples the output port 108 to the bias circuit 104. A coupling element 120 couples the output port 108 to the internal signal path 114.

Figure 2:
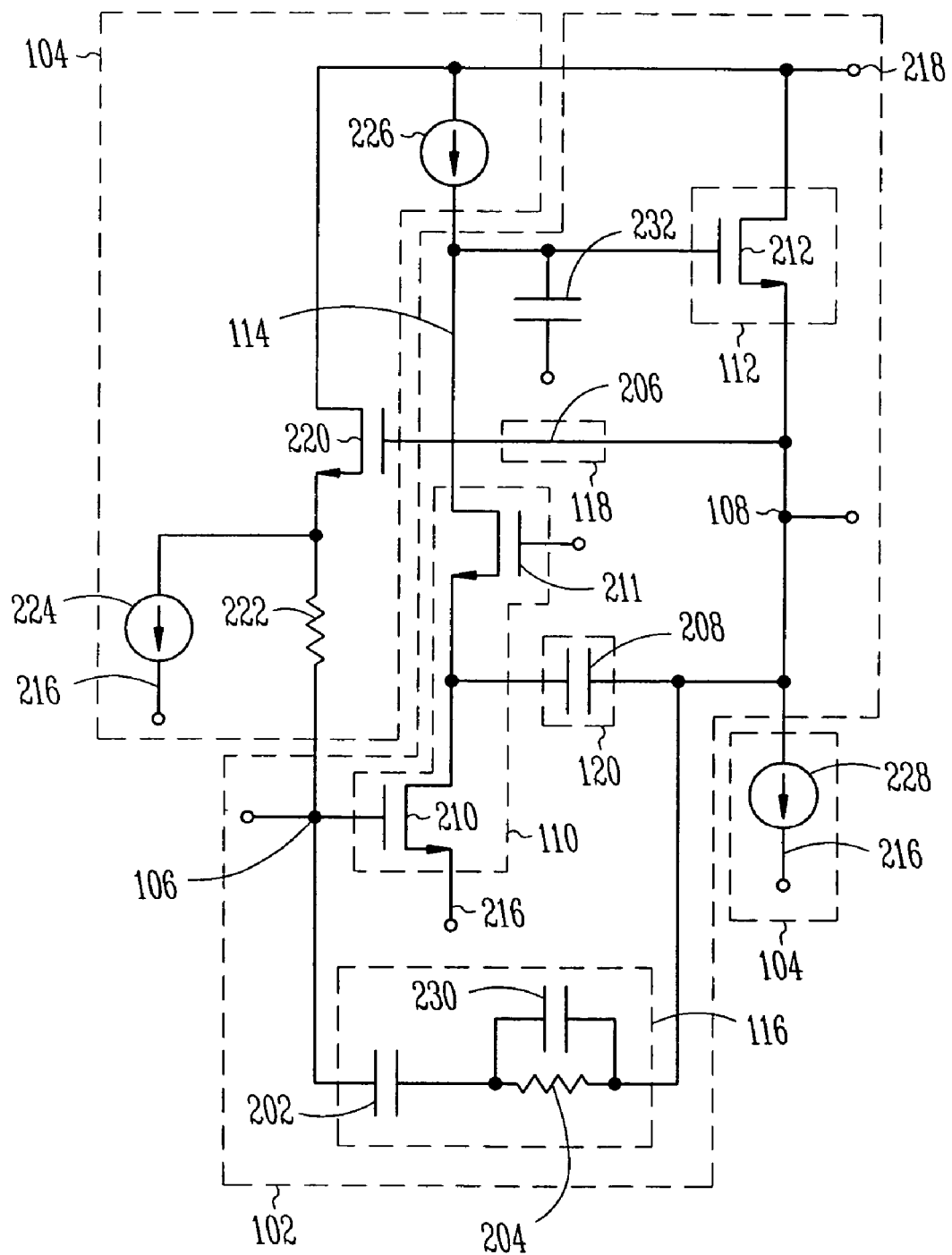
FIG. 2 is a schematic diagram of an apparatus including a schematic diagram of the amplifier circuit, shown in FIG. 1, and a schematic diagram of the bias circuit, shown in FIG. 1, in accordance with some embodiments.

The amplifier circuit 102 is not limited to a particular type of amplifier. In some embodiments, the amplifier circuit 102 includes a transistor amplifier. An exemplary transistor amplifier suitable for use in connection with the apparatus 100 includes a two-stage transistor amplifier. A two-stage transistor amplifier is an amplifier that includes two stages of amplification in the signal path of the amplifier. The signal path includes transistors in the amplifier that are not used to bias the amplifier. Transistors used to bias the amplifier include transistors that set operating points in the amplifier. A schematic diagram of a two-stage amplifier suitable for using in connection with the apparatus 100 is shown in FIG. 2 and described below.

The amplifier circuit 102 is not limited to being fabricated using a particular type of transistor. In some embodiments, the amplifier circuit 102 includes insulated gate field-effect transistors. An insulated gate field-effect transistor includes a gate node, a pair of drain/source nodes, and a channel to electronically couple together the pair of drain/source nodes. In operation, a signal at the gate node of an insulated gate field-effect transistor controls a signal at the pair of drain/source nodes. Other exemplary transistors suitable for use in connection with the amplifier 102 include bipolar junction transistors. A bipolar junction transistor includes an emitter, a base, and a collector. In a bipolar junction transistor, the base is formed from a first semiconductor material, such as n-type silicon or p-type silicon, while the emitter and the collector are formed from a second semiconductor material, such as p-type silicon or n-type silicon. In operation, a signal at the base node of an bipolar junction transistor controls a signal at the collector node of the transistor.

The transistors included in the amplifier circuit 102 are not limited to being fabricated using a particular substrate material or a particular process technology. Exemplary substrate materials suitable for use in connection with the fabrication of the amplifier circuit 102 include silicon, germanium, silicon-on-insulator, strained silicon, and gallium arsenide. Any process technology suitable for use in the fabrication of insulated gate field-effect transistors, bipolar junction transistors, or gallium arsenide metal-semiconductor field-effect transistors are suitable for use in connection with the fabrication of the amplifier circuit 102. In some embodiments, a complementary metal-oxide semiconductor (CMOS) process is used to fabricate the amplifier circuit 102. In a CMOS process both n-type and p-type insulated gate field-effect transistors can be fabricated on a substrate such as silicon.

The bias circuit 104, during the operation of the amplifier circuit 102, provides a substantially fixed voltage or current to the transistors in the signal path of the amplifier circuit 102 to define an operating point for the amplifier circuit 102. A substantially fixed voltage or current in a bias circuit is substantially fixed in the sense that a bias circuit is designed to be substantially unresponsive to changes in the signal voltage or current. Changes in an input signal at the input port 106 result in changes in an output signal at the output port 108.

The input port circuit element 110 is coupled to the input port 106. The input port circuit element 110 is not limited to a particular type of circuit element. A transistor is an example of a circuit element suitable for use as the input port circuit element 110 in connection with the amplifier circuit 102. In some embodiments, the transistor includes an insulated gate field-effect transistor. In some embodiments, the transistor includes a metal semiconductor field-effect transistor. In some embodiments, the transistor includes a bipolar junction transistor.

The output port circuit element 112 is coupled to the output port 108. The output port circuit element 112 is not limited to a particular type of circuit element. A transistor is an example of a circuit element suitable for use as the output port circuit element 112 in connection with the amplifier circuit 102. In some embodiments, the transistor includes an insulated gate field-effect transistor. In some embodiments, the transistor includes a metal semiconductor field-effect transistor. In some embodiments, the transistor includes a bipolar junction transistor.

The internal signal path 114 couples the input port circuit element 110 to the output port circuit element 112. The internal signal path 114 couples the input port circuit element 110 to the output port circuit element 112 by providing a signal path, such as a conductive path, between the input port circuit element 110 and the output port circuit element 112. Exemplary conductive paths include interconnects, active devices, and passive devices or combinations of interconnects, active devices and passive devices. Exemplary materials suitable for use in connection with the fabrication of interconnects in the internal signal path 114 include gold, aluminum, copper, and polycrystalline silicon. Exemplary passive devices suitable for use in connection with the fabrication of the internal signal path 114 include resistors, capacitors, and inductors. Exemplary active devices suitable for use in connection with the fabrication of the internal signal path 114 includes transistors.

The coupling element 116 couples the input port 106 to the output port 108. The coupling element 116 has an impedance. The impedance of the coupling element 116 contributes to the impedance at the input port 106. The coupling element 116 is not limited to a particular type of coupling element. Exemplary coupling elements suitable for use in connection with the apparatus 100 include elements that provide a signal path between the input port 106 and the output port 108. Passive circuit elements, such as resistors, capacitors and inductors and combinations of passive elements, can provide a signal path between the input port 106 and the output port 108. Active circuit elements, such as transistors, can provide a signal path between the input port 106 and the output port 108. Further, combinations of active elements and passive elements can provide a path between the input port 106 and the output port 108. In some embodiments, the coupling element 116 includes a passive circuit element. In some embodiments, the passive circuit element includes a resistor in series with a capacitor.

The coupling element 118 couples the output port 108 to the bias circuit 104. The coupling element 118 is not limited to a particular type of coupling element. Exemplary coupling elements suitable for use in connection with the apparatus 100 include elements that provide a signal path between the output port 108 and the bias circuit 104. In some embodiments, the output port 108 is coupled to the bias circuit 104 through an interconnect. An interconnect connects nodes in a circuit. In some embodiments, the interconnect includes a conductive material. Exemplary conductive materials suitable for use in connection with the fabrication of the coupling element 118 in the apparatus 100 include gold, aluminum, copper, and polycrystalline silicon.

The coupling element 120 couples the output port 108 to the internal signal path 114. The coupling element 120 is not limited to a particular type of coupling element. Exemplary coupling elements suitable for use in connection with the apparatus 100 include elements that provide a signal path between the output port 108 and the internal signal path 114. Passive circuit elements, such as resistor, capacitors and inductors and combinations of passive elements can provide a signal path between the output port 108 and the internal signal path 114. Active circuit elements, such as transistors, can provide a signal path between the output port 108 and the internal signal path 114. Further, combinations of active elements and passive elements can provide a path between the output port 108 and the internal signal path 114. In some embodiments, the coupling element 120 includes a passive circuit element. In some embodiments, the passive circuit element includes a capacitor.

FIG. 2 is a schematic diagram of an apparatus 200 including a schematic diagram of the amplifier circuit 102, shown in FIG. 1, and a schematic diagram of the bias circuit 104, shown in FIG. 1, in accordance with some embodiments. The amplifier circuit 102 includes the input port 106, the output port 108, the input port circuit element 110, the output port circuit element 112, the internal signal path 114, and the coupling elements 116, 118, and 120, all shown in FIG. 1. The input port circuit element 110 is coupled to the input port 106. The output port circuit element 112 is coupled to the output port 108. The internal signal path 114 couples the input port circuit element 110 to the output port circuit element 112. The output port 108 is coupled to the input port 106, the bias circuit 104, and the internal signal path 114. The coupling element 116 includes a capacitor 202 connected in series with a resistor 204 and couples the output port 108 to the input port 106. The coupling element 118 includes an interconnect 206 and couples the output port 108 to the bias circuit 104. The coupling element 120 includes a capacitor 208 and couples the output port 108 to the internal signal path 114. The amplifier circuit 102 is coupled to the bias circuit 104.

The amplifier circuit 102 includes transistors 210, 211, and 212 and the internal signal path 114. The internal signal path 114 couples the transistors 210 and 211 to the transistor 212. In some embodiments, the internal signal path 114 includes an interconnect. The input port 106 is coupled to the gate of the transistor 210. A drain/source of the transistor 210 is coupled to a low supply voltage source 216. A drain/source of the transistor 210 is coupled to a drain/source of the transistor 211. A drain/source of the transistor 211 is coupled to the gate of the transistor 212. A drain/source of the transistor 212 is coupled to a high supply voltage source 218. A drain/source of the transistor 212 is coupled to the output port 108. In some embodiments, the transistors 210, 211, and 212 are n-channel insulated gate field-effect transistors. In some embodiments, the amplifier circuit 102 is fabricated using a complementary metal-oxide semiconductor process and a silicon substrate.

The bias circuit 104 is coupled to the amplifier circuit 102 at the input port 106, the gate of the transistor 212, and the output port 108. The bias circuit 104, during the operation of the amplifier 102, provides a voltage or current to the nodes of the transistors in the signal path of the amplifier 102 to define an operating point for the amplifier 102. The bias circuit 104 includes a transistor 220, a resistor 222, and current sources, 224, 226, and 228. The transistor 220 is connected in series with the resistor 222. The transistor 220 and the resistor 222 are connected between the input port 106 and the high supply voltage source 218. The current source 224 is connected between a drain/source node of the transistor 220 and a low power supply source 216. The current source 226 is connected between the high power supply source 218 and the gate of the transistor 212. The value of the current provided by the current source 226 affects the gain and bandwidth of the amplifier circuit 102. Thus, the gain and bandwidth of the amplifier circuit 102 can be controlled through control of the current provided by the current source 226. The current source 228 is connected between the output port 108 and the low power supply source 216.

The internal signal path 114 couples a signal at the input port circuit element 110 to the output port circuit element 112. The internal signal path 114 couples the input port circuit element 110 to the output port circuit element 112 by providing a signal path, such as a conductive path, between the input port circuit element 110 and the output port circuit element 112. Exemplary conductive paths include interconnects, active devices, and passive devices or combinations of interconnects, active devices and passive devices. Exemplary materials suitable for use in connection with the fabrication of interconnects in the internal signal path 114 include gold, aluminum, copper, and polycrystalline silicon. Exemplary passive devices suitable for use in connection with the fabrication of the internal signal path 114 include resistors, capacitors, and inductors. Exemplary active devices suitable for use in connection with the fabrication of the internal signal path 114 includes transistors.

The capacitor 202 and the resistor 204 couple the input port 106 to the output port 108. The capacitor 202 and the resistor 204 have an impedance. The impedance contributes to the impedance at the input port 106. The value of the resistor 204 affects the gain and bandwidth of the amplifier circuit 102. Thus, the gain and bandwidth of the amplifier circuit 102 can be controlled through control of the value of the resistor 204. Stability in the amplifier 102 is improved by the addition of a capacitor 230 in parallel with the resistor 204. The value of the capacitor 230 is small when compared to the value of the capacitor 202. A first capacitor value is small when compared with a second capacitor value when the first capacitor value is about an order of magnitude less than the value of the second capacitor value.

The interconnect 206 couples the output port 108 to the bias circuit 104. The interconnect includes a conductive material. Exemplary conductive materials suitable for use in connection with the fabrication of the interconnect 206 in the apparatus 200 include gold, aluminum, copper, and polycrystalline silicon.

The capacitor 208 couples the output port 108 to the internal signal path 114. A capacitor 232 represents the parasitic capacitance at the gate of the transistor 212. Without the capacitor 208 to compensate for the capacitance of the capacitor 232, the capacitor 232 limits the bandwidth, stability, and input return loss of the amplifier 102. The capacitor 208 forms a positive feedback loop to charge the capacitor 232. The capacitor 208 contributes a zero to the transfer function of the amplifier 102 to compensate for the pole contributed by the capacitor 232. The compensation provides an improvement in the bandwidth, stability, and the return loss in the amplifier 102 when compared with an amplifier that does not include the capacitor 208. The input return loss is improved because the feedback that causes the low frequency input impedance to be approximately equal to the source impedance is operative over a wider frequency range.

Simulation of the amplifier 102 has shown the noise figure of the amplifier 102 to be comparable to the noise figure in low noise amplifiers that include inductors. An inductorless amplifier 102 takes up less die area than an amplifier that includes inductors and provides comparable performance.

Figure 3:
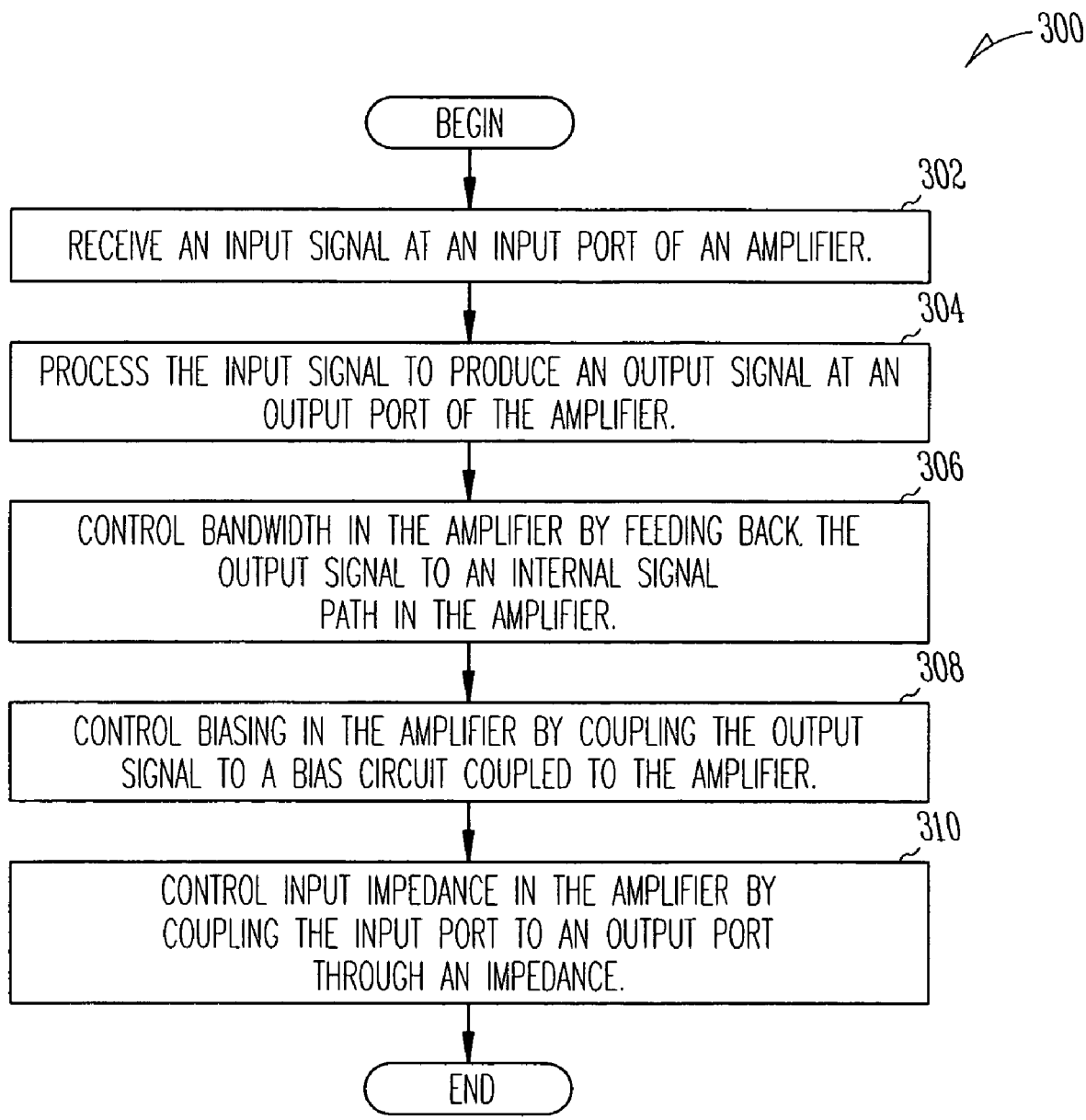
FIG. 3 is flow diagram of a method for processing signals in accordance with some embodiments.

FIG. 3 is a flow diagram of a method 300 for processing signals in accordance with some embodiments. The method 300 includes receiving an input signal at an input port of an amplifier (block 302), processing the input signal to produce an output signal at an output port of the amplifier (block 304), controlling bandwidth in the amplifier by feeding back the output signal to an internal signal path in the amplifier (block 306), controlling biasing in the amplifier by coupling the output signal to a bias circuit coupled to the amplifier (block 308), and controlling input impedance in the amplifier by coupling the input port to the output port through an impedance (block 310).

In some embodiments, controlling bandwidth in the amplifier by feeding back the output signal to an internal signal path in the amplifier includes charging a capacitance in the amplifier with the output signal. In some embodiments, controlling biasing in the amplifier by coupling the output signal to a bias circuit coupled to the amplifier includes coupling the output signal to the bias circuit through an interconnect. In some embodiments, controlling input impedance in the amplifier by coupling the input port to the output port through an impedance comprises coupling the input port to the output port through a capacitor in series with a resistor. In some embodiments, processing the input signal to produce an output signal at an output port of the amplifier comprises providing two stages of amplification between the input port and the output port.

Figure 4:
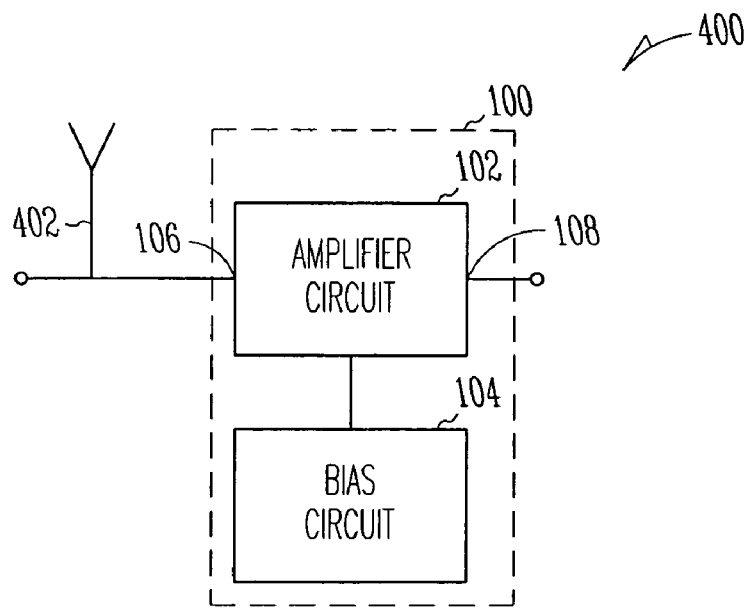
FIG. 4 is a block diagram of a system including a monopole antenna coupled to the apparatus, shown in FIG. 1, including the input port of the amplifier circuit, shown in FIG. 1, and including the amplifier circuit coupled to the bias circuit, shown in FIG. 1, in accordance with some embodiments.

FIG. 4 is a block diagram of a system 400 including a monopole antenna 402 coupled to the apparatus 100, shown in FIG. 1, including the input port 106 of the amplifier circuit 102, shown in FIG. 1, and including the amplifier circuit 102 coupled to the bias circuit 104, shown in FIG. 1, in accordance with some embodiments. The amplifier circuit 102 includes the output port 108. The monopole antenna is an antenna that includes a single conductive element. In some embodiments, the single conductive element includes a straight element.

Figure 5:
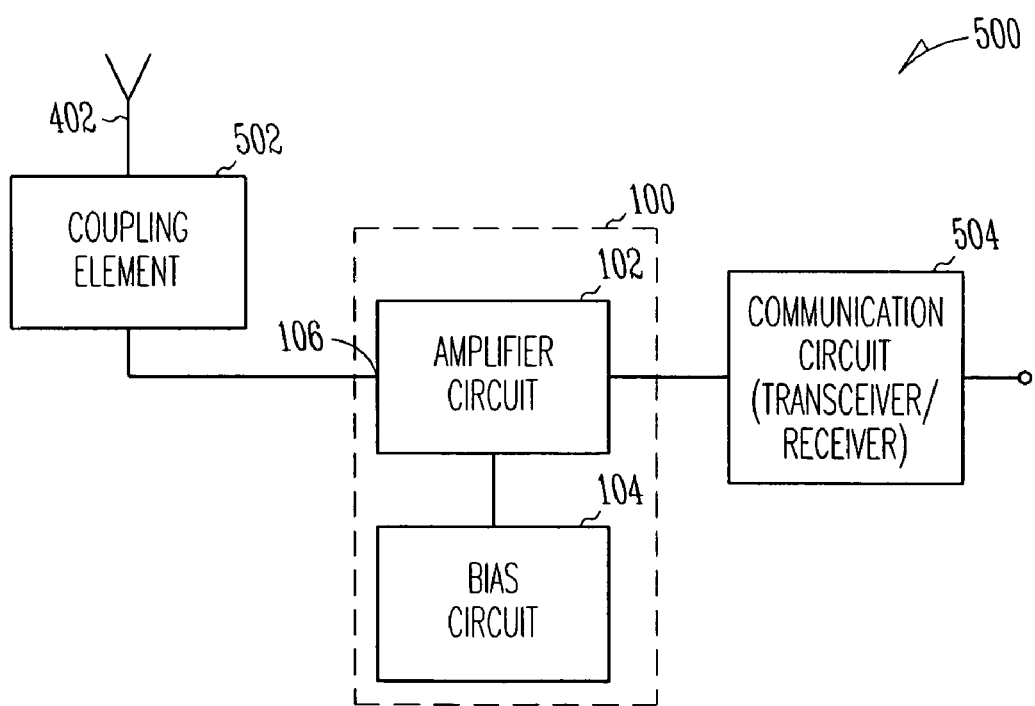
FIG. 5 is a block diagram of a system including the monopole antenna, shown in FIG. 4, coupled to the apparatus, shown in FIG. 1, including the input port of the amplifier circuit, shown in FIG. 1, through a coupling element, and including the amplifier circuit coupled to the bias circuit, shown in FIG. 1, and the communication circuit in accordance with some embodiments.

FIG. 5 is a block diagram of a system 500 including the monopole antenna 402, shown in FIG. 4, coupled to the apparatus 100, shown in FIG. 1, including the input port 106 of the amplifier circuit 102, shown in FIG. 1, through a coupling element 502, and including the amplifier circuit 102 coupled to the bias circuit 104, shown in FIG. 1, and the communication circuit 504 in accordance with some embodiments. The amplifier circuit 102 includes the output port 108. The coupling element 502 is not limited to a particular type of coupling element. In some embodiments, the coupling element 502 includes a bandpass filter. A bandpass filer includes a circuit that transmits frequencies between two other given frequencies. In some embodiments, the coupling element 502 includes a switch.

The communication circuit 504 is coupled to the output port 108 of the amplifier circuit 102. The communication circuit 504 is not limited to a particular communication circuit. In some embodiments, the communication circuit 504 includes a transceiver. A transceiver includes a transmitter and a receiver to transmit and receive a communication signal. In some embodiments, the communication circuit 504 includes a receiver to receive a communication signal.

Figure 6:
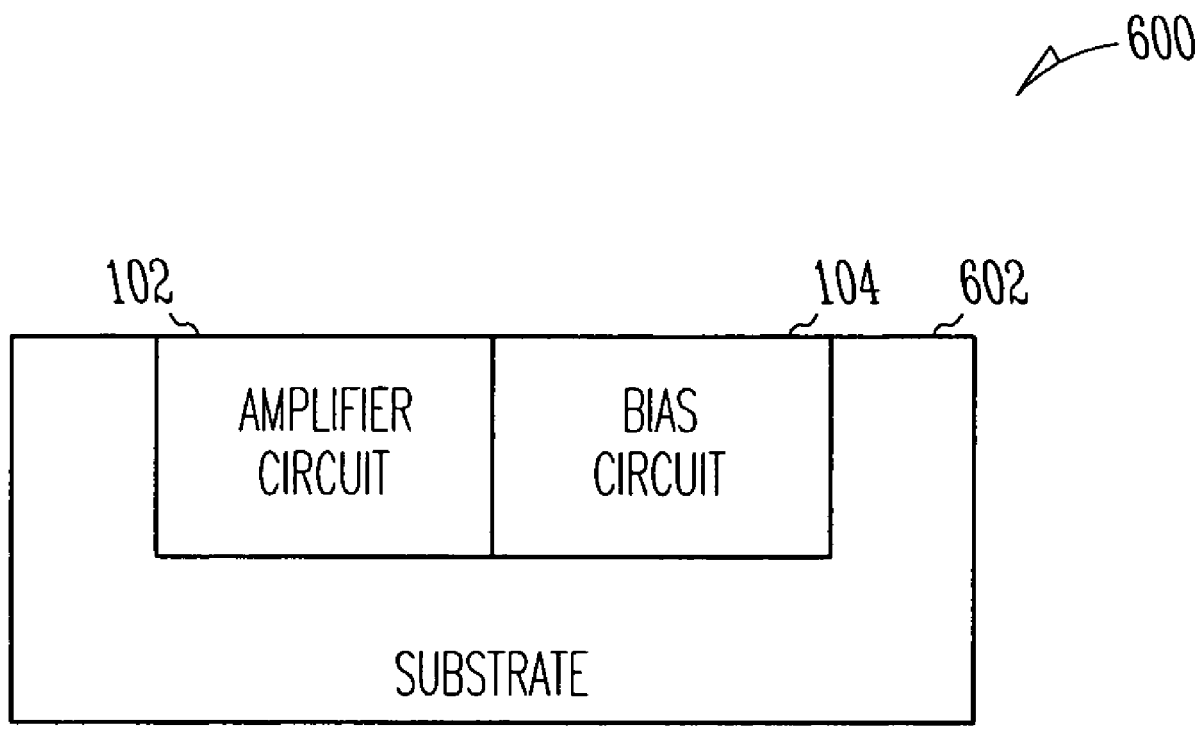
FIG. 6 is an illustration of an apparatus including the amplifier circuit, shown in FIG. 1, and the bias circuit, shown in FIG. 1, formed in connection with a substrate in accordance with some embodiments.

FIG. 6 is an illustration of an apparatus 600 including the amplifier circuit 102, shown in FIG. 1, and the bias circuit 104, shown in FIG. 1, formed in connection with a substrate 602 in accordance with some embodiments. The substrate 600 is not limited to being formed from a particular material. Exemplary materials suitable for use in connection with the fabrication of the substrate 600 include silicon, strained silicon, silicon on insulator, silicon-germanium, germanium, and gallium arsenide.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the invention. Therefore, it is intended that this invention be limited only by the claims and the equivalents thereof.

What is claimed is:

1. A method comprising:
   receiving an input signal at an input port of an amplifier;
   processing the input signal to produce an output signal at an output port of the amplifier;
   controlling bandwidth in the amplifier by feeding back the output signal to an internal signal path in the amplifier, wherein the internal signal path does not include an inductive circuit element;
   controlling biasing in the amplifier by coupling the output signal to a bias circuit coupled to the amplifier; and
   controlling input impedance in the amplifier by coupling the input port to the output port through an impedance.

2. The method of claim 1, wherein controlling bandwidth in the amplifier by feeding back the output signal to an internal signal path in the amplifier comprises charging a capacitor in the amplifier with the output signal.

3. The method of claim 1, wherein controlling biasing in the amplifier by coupling the output signal to a bias circuit coupled to the amplifier comprises coupling the output signal to the bias circuit through an interconnect.

4. The method of claim 1, wherein controlling input impedance in the amplifier by coupling the input port to the output port through an impedance comprises coupling the input port to the output port through a capacitor in series with a resistor.

5. The method of claim 1, wherein processing the input signal to produce an output signal at an output port of the amplifier comprises providing two stages of amplification between the input port and the output port.

6. The method of claim 1, wherein controlling bandwidth in the amplifier by feeding back the output signal to an internal signal path in the amplifier comprises charging a capacitor in the amplifier with the output signal.

7. The method of claim 1, wherein controlling biasing in the amplifier by coupling the output signal to a bias circuit coupled to the amplifier comprises coupling the output signal to the bias circuit through an interconnect.

8. The method of claim 1, wherein controlling input impedance in the amplifier by coupling the input port to the output port through an impedance comprises coupling the input port to the output port through a capacitor in series with a resistor.

9. The method of claim 1, wherein processing the input signal to produce an output signal at an output port of the amplifier comprises providing two stages of amplification between the input port and the output port.

10. An apparatus comprising:
    an input port of an amplifier configured to receive an input signal;
    a processing circuit configured to process the input signal to produce an output signal at an output port of the amplifier;
    an internal signal path in the amplifier configured to control a bandwidth in the amplifier by feeding back the output signal through the internal signal path, wherein the internal signal path does not include an inductive circuit element;
    a bias circuit coupled to the amplifier and coupled to the output signal to control biasing in the amplifier; and
    an impedance element that couples the input port to the output port to control an input impedance in the amplifier.

11. The apparatus of claim 10, wherein the internal signal path comprises a capacitor configured to be charged by the output signal.

12. The apparatus of claim 10, wherein the bias circuit comprises an interconnect that couples the output signal to the bias circuit.

13. The apparatus of claim 10, wherein the impedance element comprises a capacitor in series with a resistor that couples the input port to the output port.

14. The apparatus of claim 10, wherein the processing circuit comprises a two stage amplifier interposed between the input port and the output port.

15. A signal processing apparatus, comprising:
    an input port that receives an input signal;
    a signal processing circuit that receives the input signal and generates an output signal at an output port;
    an internal signal path configured to feed back the output signal through the internal signal path to control a bandwidth, wherein the internal signal path does not include an inductive circuit element;
    a bias circuit coupled to the apparatus and coupled to the output signal to control biasing; and
    an impedance element that couples the input port to the output port to control an input impedance.

16. The apparatus of claim 15, wherein the internal signal path comprises a conductive signal path interposed between the input port and the output port.

17. The apparatus of claim 16, wherein the conductive signal path comprises at least one of an interconnect, an active device and a passive device.

18. The apparatus of claim 15, wherein the internal signal path comprises a capacitor that is charged by the output signal.

19. The apparatus of claim 15, wherein the bias circuit comprises an interconnect that couples the output signal to the bias circuit.

20. The apparatus of claim 15, wherein the impedance element comprises a passive circuit element, including at least one of a resistor, a capacitor and an inductor that couples the input port to the output port.

21. The apparatus of claim 20, wherein the passive circuit element comprises a capacitor in series with a resistor that couples the input port to the output port.

22. The apparatus of claim 15, wherein the impedance element comprises an active circuit element, including at least one transistor that couples the input port to the output port.

23. The apparatus of claim 15, wherein the impedance element comprises a combination of an active element and a passive element that couple the input port to the output port.

24. The apparatus of claim 15, wherein the processing circuit comprises at least one of an insulated gate field effect transistor and a bipolar junction transistor.

25. The apparatus of claim 15, wherein the processing circuit comprises a two stage amplifier interposed between the input port and the output port.

* * * * *